United States Patent
Yim et al.

(10) Patent No.: US 7,517,917 B2
(45) Date of Patent: Apr. 14, 2009

(54) COMPOSITION FOR PREPARING NANOPOROUS MATERIAL COMPRISING CALIXARENE DERIVATIVE

(75) Inventors: Jin Heong Yim, Suwon-si (KR); Kwang Hee Lee, Suwon-si (KR)

(73) Assignee: Samsung Corning Co., Ltd., Suwon-Si, Gyeonggi-Do (KR)

( * ) Notice: Subject to any disclaimer, the term of this patent is extended or adjusted under 35 U.S.C. 154(b) by 561 days.

(21) Appl. No.: 11/245,037

(22) Filed: Oct. 7, 2005

(65) Prior Publication Data

US 2006/0094850 A1    May 4, 2006

(30) Foreign Application Priority Data

Oct. 7, 2004    (KR) .................. 10-2004-0079860

(51) Int. Cl.
*C08G 77/00* (2006.01)
*C08G 77/12* (2006.01)
*C08J 9/00* (2006.01)

(52) U.S. Cl. ................... 521/61; 521/63; 521/114; 521/154; 525/474; 524/588

(58) Field of Classification Search ............ 521/61, 521/63, 114, 154; 525/474; 524/588
See application file for complete search history.

(56) References Cited

U.S. PATENT DOCUMENTS

| 3,615,272 | A | 10/1971 | Collins et al. |
| 4,399,266 | A | 8/1983 | Matsumura et al. |
| 4,999,397 | A | 3/1991 | Weiss et al. |
| 5,965,679 | A | 10/1999 | Godschalx et al. |
| 6,093,636 | A | 7/2000 | Carter et al. |
| 6,107,357 | A | 8/2000 | Hawker et al. |
| 6,114,458 | A | 9/2000 | Hawker et al. |
| 6,623,711 | B2 * | 9/2003 | Lyu et al. ............... 423/12 |
| 7,144,453 | B2 * | 12/2006 | Yim et al. ............... 106/122 |

OTHER PUBLICATIONS

J-H Yim, Calixarene derivatives as novel nanopore Generators ofor Templates of nanoporous thin films, Macromol. Mater. Eng., 2006, 291, 369-76.*

* cited by examiner

*Primary Examiner*—Irina S Zemel
(74) *Attorney, Agent, or Firm*—Buchanan Ingersoll & Rooney PC (57) ABSTRACT

A composition for preparing a nanoporous material. The composition comprises a thermostable matrix precursor, a calixarene derivative, and a solvent. The composition may enable formation of a low dielectric constant film in which nanopores with a size not larger than 50 Å are uniformly distributed.

18 Claims, 3 Drawing Sheets

COMPOSITION FOR PREPARING NANOPOROUS MATERIAL COMPRISING CALIXARENE DERIVATIVE

BACKGROUND OF THE INVENTION

This non-provisional application claims priority under 35 U.S.C. § 119(a) on Korean Patent Application No. 2004-79860 filed on Oct. 7, 2004, which is herein incorporated by reference.

1. Field of the Invention

Embodiments of the present invention relate to a composition for preparing a nanoporous material comprising a calixarene derivative. More specifically, embodiments of the present invention relate to a composition for preparing a material in which nanopores with a size not larger than 50 Å are uniformly distributed, the composition comprising a thermostable matrix precursor, a calixarene derivative and a solvent.

2. Description of the Related Art

Nanoporous materials have drawn attention as materials for adsorbents, supports for catalysts, thermal insulators and electrical insulators in various fields. With the increasing integration of semiconductor devices, the speed between wirings has a significant impact on the performance of the semiconductor devices. Accordingly, an interlayer dielectric film having a low storage capacity is required in order to lower the resistance and capacity between wirings. For this purpose, attempts have been made to use low dielectric constant materials for interlayer dielectric films. For instance, U.S. Pat. Nos. 3,615,272, 4,399,266 and 4,999,397 disclose polysilsesquioxanes having a dielectric constant of about 2.5-3.1, which can be applied by spin-on deposition ("SOD"), and which can replace $SiO_2$ having a dielectric constant of around 4.00 applied by a conventional chemical vapor deposition (CVD) technique. Further, U.S. Pat. No. 5,965,679 teaches polyphenylenes as organic polymers having a dielectric constant between about 2.65 and about 2.70. However, this dielectric constant range is not sufficiently low to satisfy an increasing demand to fabricate high-speed devices requiring an ultra-low dielectric constant not higher than 2.50. For this reason, there have been a number of trials to incorporate air having a dielectric constant of 1.0 at the nanometer-scale level into an organic or inorganic material. A method is known for forming a nanoporous silica ($SiO_2$) using tetraethoxysilane ("TEOS") and an appropriate pore-forming agent (i.e. porogen) by a sol-gel process. According to the method taught in U.S. Pat. No. 6,114,458, a lactone-based polymer in a dendrimeric form, which can be decomposed during heating for the formation of a thin film, is used as a porogen. A further method for preparing a material having a dielectric constant (κ) lower than 3.0 is found in U.S. Pat. Nos. 6,107,357 and 6,093,636. According to this method, first, a particular amount of the lactone-based polymer or a vinyl-based polymer, e.g., polystyrene, polymethacrylate or polyester, in a dendrimeric form is mixed with an organic or inorganic matrix to form a thin film, and is then decomposed at high temperatures to form nano-scale pores. However, the porous materials prepared by the aforementioned methods have problems that the pores have a size as large as 50-100 Å and are not uniformly distributed in the matrix.

OBJECTS AND SUMMARY

Therefore, embodiments of the present invention have been made in view of the above problems of the prior art, and it is an object of embodiments of the present invention to provide a composition for preparing a nanoporous material in which nanopores having a size not larger than 50 Å are uniformly distributed, using a calixarene derivative as a novel porogen.

It is another object of embodiments of the present invention to provide a method for forming a dielectric film having a very low dielectric constant (κ) of 2.2 or less by using a composition according to embodiments of the present invention.

It is another object of embodiments of the present invention to provide a nanoporous structure in which nanopores having a size not larger than 50 Å are uniformly distributed, produced using a composition according to embodiments of the present invention.

It is still another object of embodiments of the present invention to provide a method for utilizing a composition according to embodiments of the present invention in the manufacture of heat resistant materials, electrical insulators, adsorbents, and supports for catalysts.

In accordance with one aspect of embodiments of the present invention for achieving the above objects, there is provided a composition for preparing a nanoporous material comprising: a thermostable matrix precursor; a calixarene derivative; and a solvent able to dissolve the above components.

In accordance with another aspect of embodiments of the present invention, there is provided a method for forming an interlayer dielectric film for use in a semiconductor device, the method comprising the steps of: coating a composition according to embodiments of the present invention on a semiconductor substrate by spin coating, dip coating, spray coating, flow coating, or screen printing; evaporating the solvent from the coated substrate; and heating the coated substrate to 150-600° C. under an inert atmosphere or vacuum.

In accordance with another aspect of the present invention, there is provided a nanoporous structure produced using the composition according to embodiments of the present invention.

In accordance with still another aspect of embodiments of the present invention, there is provided a method for using the nanoporous structure according to embodiments of the present invention in the manufacture of heat resistant materials, electrical insulators, adsorbents, and supports for catalysts.

BRIEF DESCRIPTION OF THE DRAWINGS

The above and other objects, features and other advantages of embodiments of the present invention will be more clearly understood from the following detailed description taken in conjunction with the accompanying drawings, in which.

DETAILED DESCRIPTION OF THE PREFERRED EMBODIMENTS

Hereinafter, embodiments of the present invention will be described in more detail.

The composition for preparing a nanoporous material according to embodiments of the present invention comprises a thermostable matrix precursor, a calixarene derivative, and a solvent dissolving the above components.

A composition of embodiments of the present invention may comprise, as a porogen, a calixarene derivative represented by Formula 1 below:

Formula 1 wherein n is an integer of 3 to 10; $R_1$ is a $C_1$-$C_{20}$ alkyl group; and $R_2$ is H, a $C_2$-$C_{30}$ acyl group, a $C_1$-$C_{20}$ alkyl group, a $C_3$-$C_{10}$ cycloalkyl group, a $C_1$-$C_{20}$ carboxyl group, a $C_1$-$C_{20}$ ester group, or a silicon (Si) compound represented by $Sir_1r_2r_3$, in which $r_1$, $r_2$ and $r_3$ are independently a $C_1$-$C_5$ alkyl group, a $C_1$-$C_5$ alkoxy group, or a $C_6$-$C_{20}$ aryl group.

A calixarene derivative used as a porogen in a composition of embodiments of the present invention is known to be a macrocyclic compound in a bowl-like shape containing benzene rings (Vogtle & Weber, Host Guest Complex Chemistry Macrocycles, 378, Springer-Verlag, 1985). The term "calixarene" comes from the Greek calix meaning "bowl" and arene. Namely, tahe calixarene derivative is a cyclic macromolecule. Since calixarene derivatives enable selective complex formation due to the presence of cavities composed of benzene rings, a great deal of research has been conducted to develop molecular capsules through selective complex formation of calixarene derivatives with metal ions and organic molecules. The present inventors have succeeded in efficient formation of pores by using calixarene derivatives as porogens.

The calixarene derivative of Formula 1 as a porogen used in embodiments of the present invention may have the following stereostructures:

Specific, non-limiting examples of the porogen include 4-tert-1-methylcalix[4]arene, 4-tert-butyl-1-acetylcalix[4]arene, 4-tert-1-methylbutylcalix[6]arene, and 4-tert-butyl-1-acetylcalix[6]arene, which are represented by the following Formulae 2 to 5, respectively:

Formula 2

Formula 3

Formula 4

Formula 5

The calixarene derivatives of Formulae 2 to 5 may be prepared through a variety of procedures suggested in "Gutsche, et al., J. Am. Chem. Soc., Vol. 103, No. 13, 1981". Specifically, the calixarene derivatives may be prepared through Reactions 1 to 4 below:

Reaction 1

-continued

These reactions will be described in greater detail in the Examples section that follows.

Since even small amounts of the porogens can form a sufficiently large number of pores, the porogens may be applied to various thin-film formation processes and at the same time enable formation of thin films having superior mechanical properties relative to the same dielectric constant by designing an optimized porous structure. Specifically, the porogen used in embodiments of the present invention may have a symmetric structure and may be prepared by a unimolecular template approach. According to this approach, since a hydrophobic moiety is formed at one side of the molecules and a hydrophilic moiety is formed at the other side of the molecules, the interaction between the molecules is weakened. When the molecules are introduced into a siloxane precursor containing a hydrophilic group (e.g., Si—OH group), porogen domains, such as micelles, may be formed inside the precursor. This formation of porogen domains enables formation of pores having a size of 5 nm or less, facilitates control of functional groups in the derivatives, and stabilizes the pores. In addition, a calixarene derivative used in embodiments of the present invention may increase the molecular volume, and may decrease the number of functional groups per unit volume, thus preventing the pores from collapsing.

The thermostable matrix precursor contained in a composition of embodiments of the present invention may be an inorganic or organic polymer having a glass transition temperature ($T_g$) of at least 400° C.

Examples of the inorganic polymer include (1) silsesquioxanes, (2) condensation products of alkoxysilanes, (3) organic silicates whose composition of $RSiO_3$ or $R_2SiO_2$ (wherein R is an organic substituent) is organically modified, and (4) partially condensed orthosilicates having the composition $SiOR_4$ (wherein R is an organic substituent), all of which comprise silicon, carbon, oxygen, and hydrogen.

The silsesquioxanes derived from organic polysiloxanes may be exemplified by hydrogen silsesquioxane, alkyl silsesquioxanes, aryl silsesquioxanes, and copolymers of these silsesquioxanes. Examples of alkyl silsesquioxanes include, but are not limited to, methyl silsesquioxane, ethyl silsesquioxane, and propyl silsesquioxane. Examples of aryl silsesquioxanes include, but are not limited to, phenyl silsesquioxane. Examples of copolymers of these silsesquioxanes include, but are not limited to, copolymers of hydrogen silsesquioxane and phenyl silsesquioxane, copolymers of methyl silsesquioxane and ethyl silsesquioxane, and copolymers of methyl silsesquioxane and vinyl silsesquioxane.

The condensation products of alkoxysilanes may refer to materials prepared by partial condensation of alkoxysilanes to a number-average molecular weight of 500-20,000. As such alkoxysilanes, there may be mentioned, for example, tetraethoxysilane, and tetramethoxysilane.

In the composition $RSiO_3$ or $R_2SiO_2$ of the organic silicates, the substituent R or $R_2$ may be an alkyl group, such as methyl, ethyl, and propyl.

In the composition $SiOR_4$ of the orthosilicates, the substituent $R_4$ may be an alkyl group, such as methyl, ethyl, and propyl.

In addition, as a thermostable organic matrix precursor, there may be used an organic polymer that can be cured at high temperatures to form a stable reticular structure. Non-limiting examples of the organic polymer include polyimide-based polymers which can undergo imidization, such as poly(amic acid) and poly(amic acid ester); polybenzocyclobutene-based polymers; and polyarylene-based polymers, such as polyphenylene and poly(arylene ethers).

The matrix precursor is more preferably a highly soluble organic polysiloxane-based resin having a silanol group (Si—OH) content of at least 10 mole % and preferably at least 25 mole %, which is prepared by hydrolysis and condensation of a cyclic siloxane monomer alone or a mixture with another cyclic siloxane monomer in the presence of an appropriate catalyst, or by hydrolysis and condensation of a cyclic siloxane monomer and an optional silane-based monomer. When the Si—OH content is at least 10 mole %, a composition of embodiments of the present invention shows not only satisfactory mechanical strength but also good compatibility with the calixarene derivative.

The cyclic siloxane monomer used to prepare the matrix precursor may be a compound wherein silicon atoms are linked to each other via oxygen atoms to form a cyclic structure, and the end of each branch contains organic groups constituting a hydrolyzable substituent. The cyclic siloxane monomer may be represented by Formula 6 below:

Formula 6 wherein $R_1$ is a hydrogen atom, a $C_1$-$C_3$ alkyl group, or a $C_6$-$C_{15}$ aryl group; $X_1$, $X_2$ and $X_3$ are independently a hydrogen atom, a $C_1$-$C_3$ alkyl group, a $C_1$-$C_{10}$ alkoxy group, or a halogen atom, at least one of these substituents being a hydrolyzable functional group; m is an integer ranging from 1 to 10; and p is an integer ranging from 3 to 8; or Formula 7 below:

Formula 7 wherein $R_1$ is a hydrogen atom, a $C_1$-$C_3$ alkyl group, or a $C_6$-$C_{15}$ aryl group; $R_2$ is a hydrogen atom, a $C_1$-$C_{10}$ alkyl group, or $SiX_1X_2X_3$ (in which $X_1$, $X_2$ and $X_3$ are independently a hydrogen atom, a $C_1$-$C_3$ alkyl group, a $C_1$-$C_{10}$ alkoxy group, or a halogen atom); and p is an integer between 3 and 8.

The method for preparing the cyclic siloxane monomers is not specifically limited, but hydrosililation using a metal catalyst is preferred.

As suitable cyclic siloxane monomers, commercially available siloxane monomers whose terminal functional groups are halogen atoms may be used without any modification or after converting the terminal halogen atoms into alkyl or alkoxy groups. Such a conversion method is not specifically limited as long as it does not impair the objects of embodiments of the present invention, and may be one previously known in the art. For example, conversion of terminal halogen atoms into alkoxy groups may be carried out by reacting the siloxane monomers with alcohol and triethylamine.

Specifically, the cyclic siloxane monomer may be a monomer represented by Formula 8 below:

Formula 8 or a monomer represented by Formula 9 below:

Formula 9

The compound of Formula 8 corresponds to that of Formula 6 wherein $R_1$ is a methyl group, $X_1$, $X_2$ and $X_3$ are all methoxy groups, m is 1, and p is 4. The compound of Formula 9 corresponds to that of Formula 7 wherein $R_1$ is a methyl group, $R_2$ is $Si(OCH_3)$, and p is 4.

The silane-based monomer used in the preparation of the matrix precursor may contain organic groups that form a hydrolyzable substituent at the end of each branch, and may be represented by Formula 10 below:

$$RSiX_1X_2X_3$$ Formula 10 wherein R is a hydrogen atom, a $C_1$-$C_3$ alkyl group, a $C_3$-$C_{10}$ cycloalkyl group, or $C_6$-$C_{15}$ aryl group; and $X_1$, $X_2$ and $X_3$ are independently a $C_1$-$C_3$ alkyl group, a $C_1$-$C_{10}$ alkoxy group, or a halogen atom.

Specific, non-limiting examples of the silane-based monomer include phenyltrimethoxysilane, tetramethoxysilane, and methyltrimethoxysilane represented by Formula 11 below:

Formula 11

In view of the objects of embodiments of the present invention, it is more preferred that the monomer of Formula 9 and the monomer of Formula 11 are used in a molar ratio ranging from 0.01:0.99 to 0.99:0.01 to prepare a matrix precursor used in embodiments of the present invention.

Preferred conditions for the hydrolysis and condensation during preparation of the matrix precursor are as follows. The acid catalyst used herein is not specifically limited, but is preferably hydrochloric acid, benzenesulfonic acid, oxalic acid, nitric acid, formic acid, or a mixture thereof. The equivalence ratio of the water used during the hydrolysis and condensation to reactive groups present in the monomers may be in the range of 1.0-100.0:1, and preferably 1.0-10.0:1.

The reaction may be carried out at 0-200° C. for 1-100 hrs and preferably at 50-110° C. for 5-48 hrs.

A composition of embodiments of the present invention may be prepared by dissolving the thermostable matrix precursor and the thermally unstable calixarene porogen in an appropriate solvent. The content of the calixarene derivative may be in the range of 0.1%-95% by weight, and preferably 10%-70% by weight, based on the total solid content (i.e. the sum of the amounts of the calixarene derivative and the matrix precursor) of the composition according to embodiments of the present invention.

Examples of the solvent used in embodiments of the present invention include, but are not limited to, aromatic hydrocarbons, such as anisole, xylene, and mesitylene; ketones, such as methyl isobutyl ketone, 1-methyl-2-pyrrolidinone, and acetone; ethers, such as tetrahydrofuran, and isopropyl ether; acetates, such as ethyl acetate, butyl acetate, and propylene glycol monomethyl ether acetate; amides, such as dimethylacetamide, and dimethylformamide; γ-butyrolactone; alcohols, such as isopropyl alcohol, butyl alcohol, and octyl alcohol; silicon solvents; and mixtures thereof.

The solvent may preferably be used in an amount sufficient to dissolve the matrix precursor up to a concentration required for application on a substrate. The solvent may be present in the range of 20%-99.9% by weight and preferably 70%-95% by weight in the composition.

Embodiments of the present invention may also be directed to a method for forming an interlayer dielectric film for use in a semiconductor device by applying a composition according to embodiments of the present invention to a semiconductor substrate to form a nanoporous thin film. A method of embodiments of the present invention will be specifically explained below.

First, a composition of embodiments of the present invention may be applied to a substrate by spin coating, dip coating, spray coating, flow coating, screen printing, or so on. The application is preferably carried out by spin coating at a speed of 1,000-5,000 rpm. After coating, the organic solvent may be evaporated from the coated substrate to deposit a resinous film on the substrate. The evaporation may be carried out by exposing the coated substrate to atmosphere (simple air-drying), subjecting the substrate to vacuum conditions at the initial stage of subsequent curing step, or mild heating at 100° C. or lower.

The resulting coating film may be cured by heating it at a temperature of 150° C.-600° C., preferably 200° C.-450° C. wherein pyrolysis of the calixarene derivative occurs, thereby providing a crack-free insoluble film. As used herein, by "crack-free film" is meant a film without any crack when observed under an optical microscope at a magnification of 1,000×. As used herein, by "insoluble film" is meant a film which is substantially insoluble in any solvent described as being useful for the coating and deposition of the siloxane-based resin. The heat-curing of the coating film may be performed under an inert gas (nitrogen, argon, etc.) atmosphere or vacuum for 10 hrs, and preferably 0.5-1 hr.

Following the heat-curing, fine pores with a size of about 50 Å or less may be formed in the matrix, leading to a thin film having a dielectric constant (κ) of 2.5 or lower. Moreover, a thin film having an ultra-low dielectric constant below 2.2, which is useful as an interlayer dielectric film for a semiconductor device, may be formed, for example, by appropriately controlling the content of the matrix precursor and the calixarene derivative.

Embodiments of the present invention will now be described in more detail with reference to the following examples. However, these examples are given for the purpose of illustration and are not to be construed as limiting the scope of the invention.

EXAMPLE 1

Synthesis of Matrix Monomer

Example 1-1

Synthesis of Monomer "a"

A solution of 21.4 mmol (3.8 g) of palladium (II) dichloride [PdCl$_2$(II)] in 50 ml of carbon tetrachloride was placed in a flask, and then 41.6 mmole (10.00 g) of 2,4,6,8-tetramethyl-2,4,6,8-cyclotetrasiloxane was slowly added thereto. The mixture was allowed to react at room temperature for about 10 minutes. The reaction mixture was sequentially filtered through celite and MgSO$_4$. The obtained filtrate was diluted in 200 ml of tetrahydrofuran, and then 183.0 mmol (18.5 g) of triethylamine was added thereto. The resulting mixture was stirred at room temperature for 10 minutes, and then an excess of methyl alcohol (11.7 g, 366.1 mmol) was added thereto. The resulting mixture was reacted for 5 hours. The reaction mixture was filtered through celite, and the filtrate was concentrated at reduced pressure (approx. 0.1 torr) to remove volatile substances, affording monomer "a" represented by Formula 9 below:

Formula 9

The analytical results of the $^1$H-NMR spectrum (300 MHz) of the monomer "a" are as follows: δ 0.067 (s, 12H, 4×[—CH$_3$]), 3.55 (s, 12H, 4×[—OCH$_3$]).

EXAMPLE 2

Preparation of Matrix Precursor

Precursor A: Copolymerization of Monomer "a" and Methyltrimethoxysilane (MTMS)

After 37.86 mmol (5.158 g) of methyltrimethoxysilane and 3.79 mmol (3.162 g) of the monomer "a" of Formula 9 were charged into a flask, the mixture was diluted in 100 ml of tetrahydrofuran. Separately, water and concentrated hydrochloric acid (containing 35% hydrogen chloride) were mixed in a ratio of 100:0.12 (v/v) to prepare hydrochloric acid in which the hydrogen chloride was present in an amount of 0.0159 mmol. The hydrochloric acid thus prepared was slowly added to the previous mixture, and then water was slowly added thereto until the total amount of water, including water contained in the hydrochloric acid was 529.67 mmol (9.534 g). The reaction temperature was gradually increased to 70° C. At this temperature, the reaction was continued for 16 hours. The reaction solution was transferred to a separatory funnel, and then 100 ml of diethyl ether was added thereto, followed by washing with water (100 ml×5) and addition of anhydrous sodium sulfate (5 g). The resulting mixture was stirred at room temperature for 10 hours to remove the small quantity of water that remained, and filtered to obtain a colorless clear solution. The solution was concentrated at reduced pressure (about 0.1 torr) to remove volatile substances, affording 5.5 g of matrix precursor "A" (hereinafter, referred to as 'precursor A') as a white powder. The contents (%) of Si—OH, Si—OCH$_3$ and Si—CH$_3$ in the precursor A were determined through $^1$H-NMR analysis. Specifically, the respective contents were obtained by substituting the areas under the characteristic peaks into the following Equations 1 through 3 below:

Si—OH (%)=Area (Si—OH)÷[Area (Si—OH)+Area (Si—OCH$_3$)/3+Area (Si—CH$_3$)/3]×100  [Equation 1]

Si—OCH$_3$ (%)=Area (Si—OCH$_3$)/3÷[Area (Si—OH)+Area (Si—OCH$_3$)/3+Area (Si—CH$_3$)/3]×100  [Equation 2]

Si—CH$_3$ (%)=Area (Si—CH$_3$)/3÷[Area (Si—OH)+Area (Si—OCH$_3$)/3+Area (Si—CH$_3$)/3]×100  [Equation 3]

As a result, the contents of Si—OH (%), Si—OCH₃ and Si—CH₃ in the precursor "A" were 24.60%, 0.82%, and 74.6%, respectively. The molecular weight and molecular weight distribution of the precursor "A" were analyzed by gel permeation chromatography (Waters Co.). As a result, the molecular weight of the precursor "A" was 3,620 and the molecular weight distribution of the precursor "A" was 1.936.

EXAMPLE 3

Preparation of Calixarene Derivatives

Example 3-1

1-tert-butylcalix[4]arene 4-tert-butylcalix[4]arene-O,O',O",O'''-tetraacetic acid tetraethyl ester of Formula 12 below (hereinafter, referred to as 'porogen 1') was purchased from Aldrich and used without further purification.

Formula 12

R = CH₂COOCH₂CH₃

Example 3-2

5,11,17,23,29,35-Hexa-tert-butyl-37,38,39,40,41,42-hexa-acetoxylcalix[6]arene 5,11,17,23,29,35-Hexa-tert-butyl-37,38,39,40,41,42-hexa-acetoxylcalix[6]arene of Formula 13 below was prepared in accordance with the following procedure. First, 3.0 g (3.09 mmol) of 4-tert-butylcalix[6]arene was dissolved in 90 ml of acetic anhydride, and then three drops of concentrated sulfuric acid were added thereto. The reaction mixture was refluxed for 3 hours. After the resulting mixture was allowed to cool to room temperature, it was poured on ice-water and extracted with chloroform. The obtained organic layer was dried over sodium sulfate, filtered, and dried in vacuo, giving 3.68 g of the title compound as a white product (hereinafter, referred to as 'porogen 2').

Formula 13

R = COCH₃

The analytical results of the ¹H-NMR spectrum (300 MHz, CDCl₃) of the porogen are as follows: δ 7.2-6.7 (br, s, 2H, ArH), 3.8-3.4 (br, s, 2H, CH₂), 2.3-1.5 (br, s, OCOCH₃), 1.2 (s, 9H, —C(CH₃)₃).

EXAMPLE 4

Formation of Nanoporous Thin Films

The siloxane-based resin matrix precursor prepared in Example 2, the calixarene compound prepared in Example 3, and propylene glycol methyl ether acetate were mixed together in accordance with the particular ratios described in Table 1 below to prepare corresponding compositions according to embodiments of the present invention (Examples 4-(1) to 4-(8)). The solid content indicated in Table 1 refers to a weight percentage of the corresponding siloxane-based resinous matrix precursor and calixarene compound, relative to the total weight of the composition (i.e., siloxane resinous matrix precursor+calixarene compound+propylene glycol methyl ether acetate). The porogen content represents a weight percentage of the corresponding calixarene derivative in the solid content.

These compositions were spin-coated onto different boron-doped p-type silicon wafers at 3,000 rpm. Then, the wafers were sequentially soft-baked on a hot plate coated with a siloxane-based resin at 150° C. for 1 minute and at 250° C. for 1 minute, to completely remove organic solvents. The baked substrates were cured in a Linberg furnace under vacuum at 420° C. for 60 minutes to form films with low dielectric constant.

For comparison, compositions were prepared by using heptakis(2,3,6-tri-O-methyl)-β-cyclodextrin (tCD), instead of the calixarene derivatives as porogens, in accordance with the particular ratios described in Table 1 (Comparative Examples 4-(1) to 4-(5)). Thin films were formed in the same manner as in Example 4, except that the compositions of Comparative Examples 4-(1) to 4-(5) were used.

TABLE 1

| Example No. | Solid content (Precursor + porogen) (wt %) | Kind of precursors | Porogen Kind | Porogen Content (wt %) |
|---|---|---|---|---|
| Example 4-(1) | 30 | A | 1 | 20 |
| Example 4-(2) | 30 | A | 1 | 30 |
| Example 4-(3) | 30 | A | 1 | 40 |
| Example 4-(4) | 30 | A | 1 | 50 |
| Example 4-(5) | 30 | A | 2 | 20 |
| Example 4-(6) | 30 | A | 2 | 30 |
| Example 4-(7) | 30 | A | 2 | 40 |
| Example 4-(8) | 30 | A | 2 | 50 |
| Comp. Ex. 4-(1) | 30 | A | — | 0 |
| Comp. Ex. 4-(2) | 30 | A | tCD | 20 |
| Comp. Ex. 4-(3) | 30 | A | tCD | 30 |
| Comp. Ex. 4-(4) | 30 | A | tCD | 40 |
| Comp. Ex. 4-(5) | 30 | A | tCD | 50 |

EXAMPLE 5

Measurement of Thickness, Refractive Index, Dielectric Constant and Mechanical Properties The thickness, refractive index, dielectric constant and mechanical properties of the low-electric thin films formed in Example 4 were measured, and the obtained results are shown in Table 2 below.

(1) The thickness and refractive index of the dielectric films were measured using a prism coupler.

(2) The dielectric constant was measured in accordance with the following procedure. First, MIM (metal-insulator-metal)-structured test pieces were produced using the thin films. The dielectric constant was measured around 100 kHz using an LCR METER (HP4284A) accompanied with a probe station.

(3) The modulus and hardness were determined by a continuous stiffness measurement (CSM) using a nanoindenter II (MTS).

TABLE 2

| Example No. | Solid content (Precursor + porogen) (wt %) | Kind of precursor | Porogens Kind | Content (wt %) | Thickness (nm) | Refractive Index | Dielectric constant | Modulus (Gpa)$^b$ | Hardness (Gpa)$^b$ | Porosity (%)$^a$ | Pore size (nm) |
|---|---|---|---|---|---|---|---|---|---|---|---|
| Example 5-(1) | 30 | A | 1 | 20 | 13786 | 1.2986 | 2.10 | 5.24 | 0.86 | 20.65 | 2.04 |
| Example 5-(2) | 30 | A | 1 | 30 | 15017 | 1.2555 | 1.93 | 3.14 | 0.51 | 31.33 | 2.42 |
| Example 5-(3) | 30 | A | 1 | 40 | 13631 | 1.2139 | 1.88 | 2.88 | 0.46 | 41.90 | 2.72 |
| Example 5-(4) | 30 | A | 1 | 50 | 11394 | 1.2085 | 1.59 | 2.10 | 0.40 | 43.30 | 2.95 |
| Example 5-(5) | 30 | A | 2 | 20 | 13205 | 1.3225 | 2.41 | 4.21 | 0.62 | 14.70 | 3.60 |
| Example 5-(6) | 30 | A | 2 | 30 | 13358 | 1.2678 | 2.06 | 2.81 | 0.40 | 28.34 | — |
| Example 5-(7) | 30 | A | 2 | 40 | 13521 | 1.2239 | 1.79 | 1.73 | 0.26 | 39.40 | — |
| Example 5-(8) | 30 | A | 2 | 50 | 11162 | 1.1746 | 1.49 | 1.49 | 0.13 | 52.18 | — |
| Comp. Ex. 5-(1) | 30 | A | — | 0 | 14205 | 1.3856 | 3.04 | 8.99 | 1.45 | 0.0 | 0.60 |
| Comp. Ex. 5-(2) | 30 | A | tCD | 20 | 15824 | 1.3129 | 2.51 | 4.29 | 0.75 | 16.33 | 1.54 |
| Com. Ex. 5-(3) | 30 | A | tCD | 30 | 14577 | 1.2916 | 2.35 | 3.34 | 0.60 | 21.58 | 1.71 |
| Comp. Ex. 5-(4) | 30 | A | tCD | 40 | 12421 | 1.2780 | 2.17 | 3.09 | 0.52 | 24.96 | 1.76 |
| Comp. Ex. 5-(5) | 30 | A | tCD | 50 | 10754 | 1.2702 | 2.10 | 2.71 | 0.47 | 26.92 | 1.78 |

Figure 1:
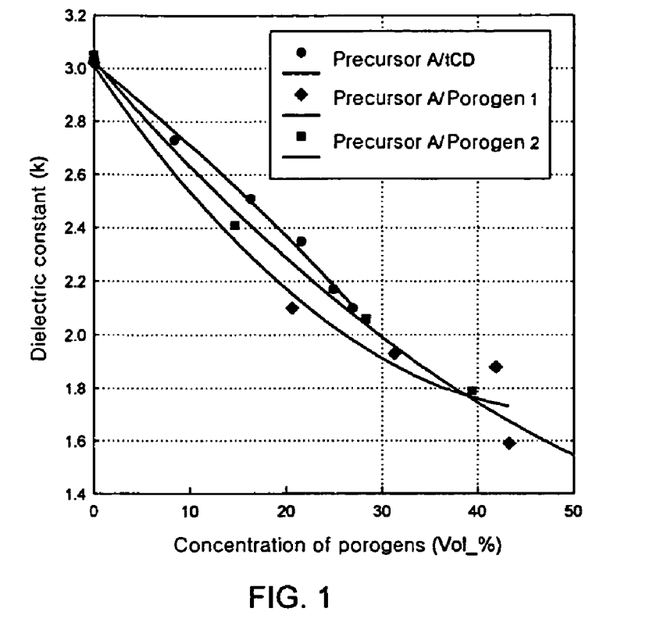
FIG. 1 is a graph showing the relation between the dielectric constant of thin films formed in Example 4 and the concentration of porogens.
Figure 2:
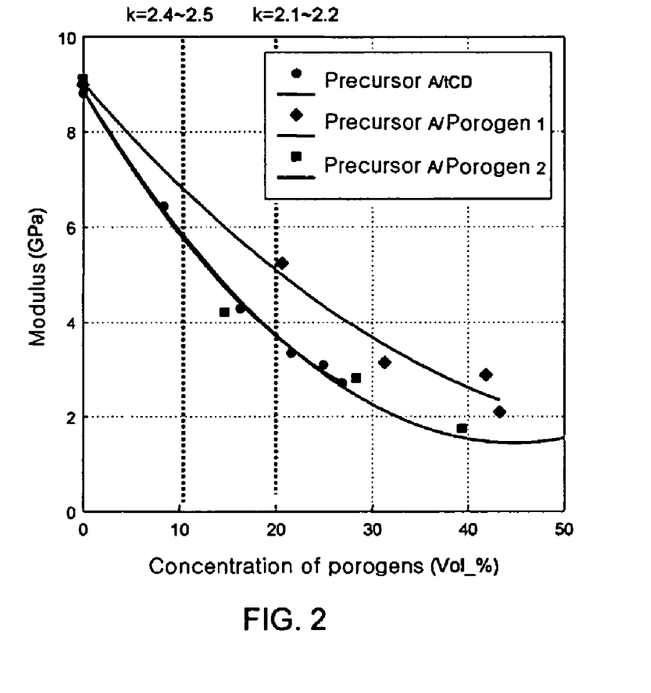
FIG. 2 is a graph showing the relation between the modulus of thin films formed in Example 4 and the concentration of porogens.
Figure 3:
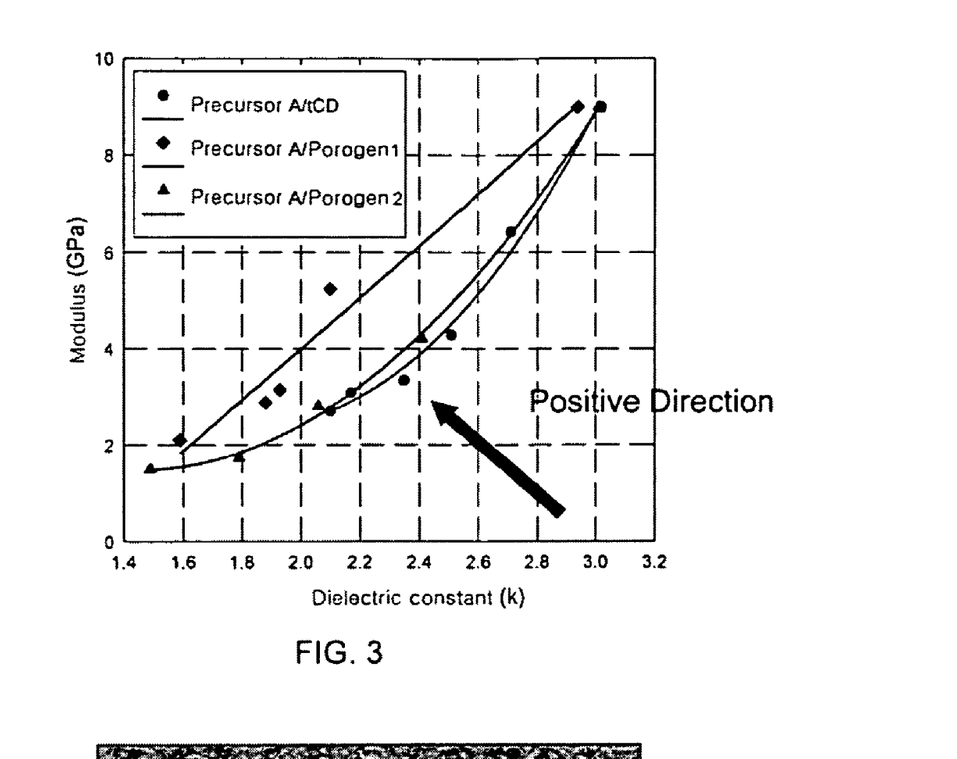
FIG. 3 is a graph showing the relation between the modulus and the dielectric constant of thin films formed in Example 4.

Based on the data shown in Table 2, the relation between the dielectric constant of the thin films formed in Example 4 and the concentration of the porogens used, the relation between the modulus of the thin films formed in Example 4 and the concentration of porogens used, and the relation between the modulus and the dielectric constant of the thin films formed in Example are graphically shown in FIGS. 1 to 3, respectively. The graphs demonstrate that the calixarene derivatives as porogens used in embodiments of the present invention increase the modulus of the thin films while efficiently lowering the dielectric constant of the thin films, compared to the conventional porogen.

EXAMPLE 6

Observation of Nanopores in Thin Films

Figure 4:
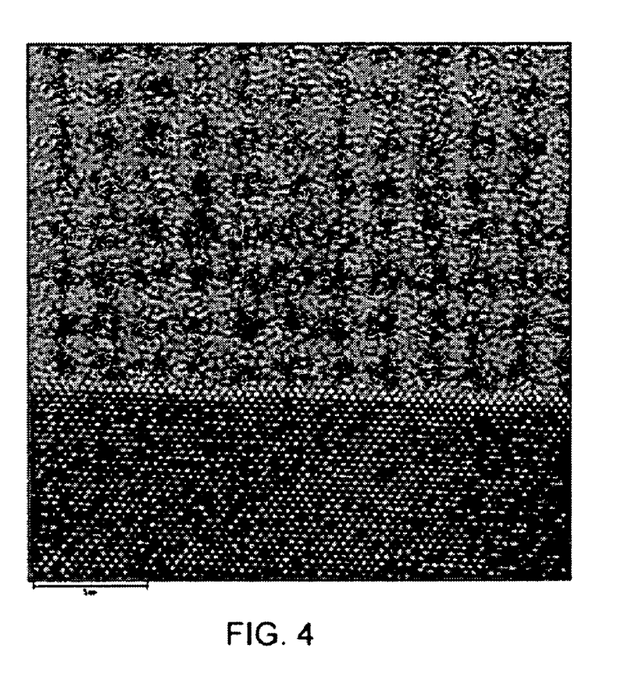
FIG. 4 is a cross-sectional image by transmission electron microscopy (TEM) of a thin film formed using a composition prepared in Example 4.
Figure 5:
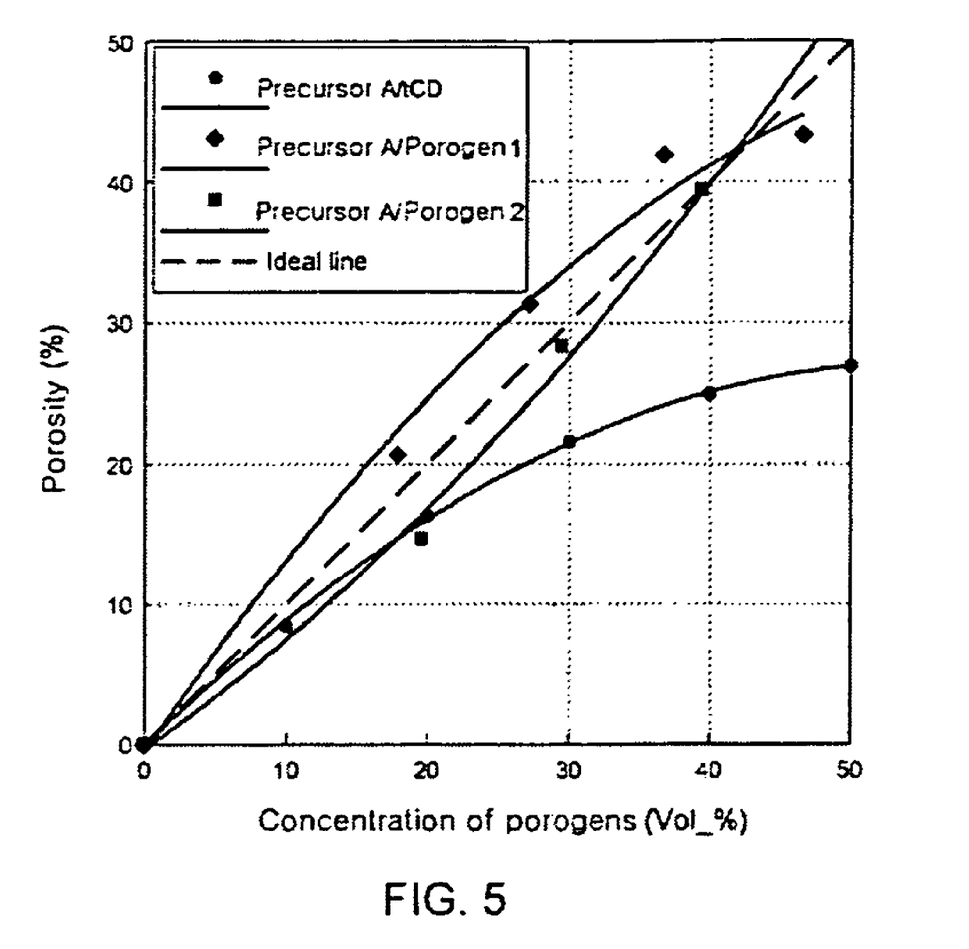
FIG. 5 is a graph showing the relation between the porosity of thin films formed in Example 4 and the concentration of porogens.

To observe whether nanopores were uniformly formed in the thin films or not, cross-sectional images of the thin films were taken using TEM H9000NA at 300 kV. The cross-sectional TEM image of the thin film formed using the composition prepared in Example 4-2 is shown in FIG. 4. No nanopore having a size of 50 Å or more, which results from agglomeration of porogens, was found, and thus it could be confirmed from this observation that nanopores were uniformly formed in the thin films. The pore size (nm) was quantitatively measured by positron annihilation lifetime spectroscopy (PALS). The results are shown in Table 2. Based on the results shown in Table 2, a graph showing changes in the porosity of the thin films formed in Example 4 with increasing proportions of porogens was plotted (FIG. 5). As can be seen from the results shown in FIG. 5, as the porogen content increases, the porosity of the thin films formed using the calixarene derivatives constantly increases when compared to that of the thin films formed using tCD as a porogen.

As apparent from the above description, nanoporous materials containing optimized pores may be prepared using the composition of embodiments of the present invention despite the presence of a small amount of the calixarene derivative as a porogen. Further, the use of a composition according to embodiments of the present invention enables formation of thin films having superior mechanical properties relative to the same dielectric constant.

Although the preferred embodiments of embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A composition for preparing a nanoporous material, comprising:
    a thermostable matrix precursor having a glass transition temperature (Tg) of at least 400° C. which is selected from the group consisting of organic polysiloxane-based resin, organic silicates, partially condensed orthosilicates, polyimide-based polymers capable of undergoing imidization, polybenzocyclobutene-based polymers, and polyphenylene-based polymers;
    a calixarene derivative represented by Formula 1 below:

(1)

wherein n is an integer of 3 to 10; $R_1$ is a $C_1$-$C_{20}$ alkyl group; and $R_2$ is H, a $C_2$-$C_{30}$ acyl group, a $C_1$-$C_{20}$ alkyl group, a $C_3$-$C_{10}$ cycloalkyl group, a $C_1$-$C_{20}$ carboxyl group, a $C_1$-$C_{20}$ ester group, or a silicon compound represented by $Sir_1r_2r_3$, in which $r_1$, $r_2$ and $r_3$ are independently a $C_1$-$C_5$ alkyl group, a $C_1$-$C_5$ alkoxy group, or a $C_6$-$C_{20}$ aryl group; and a solvent which is capable of dissolving the above components.

2. The composition according to claim 1, wherein the calixarene derivative is selected from the group consisting of 4-tert-1-methylcalix[4]arene, 4-tert-butyl -1 -acetylcalix[4]arene, 4-tert-1-methylbutylcalix[6]arene, and 4-tert-butyl-1-acetylcax [6]arene.

3. The composition according to claim 1, wherein the thermostable matrix precursor is a siloxane-based resin prepared by hydrolysis and condensation of a compound represented by Formula 6 below:

(6)

wherein $R_1$ is a hydrogen atom, a $C_1$-$C_3$ alkyl group, or a $C_6$-$C_{15}$ aryl group; $X_1$, $X_2$ and $X_3$ are, independently, a hydrogen atom, a $C_1$-$C_3$ alkyl group, a $C_1$-$C_{10}$ alkoxy group, or a halogen atom, at least one of these substituents being a hydrolyzable functional group; m is an integer ranging from 1 to 10; and p is an integer ranging from 3 to 8; or Formula 7 below:

(7)

wherein $R_1$ is a hydrogen atom, a $C_1$-$C_3$ alkyl group, or a $C_6$-$C_{15}$ aryl group; $R_2$ is a hydrogen atom, a $C_1$-$C_{10}$ alkyl group, or $SiX_1X_2X_3$, in which $X_1$, $X_2$ and $X_3$ are, independently, a hydrogen atom, a $C_1$-$C_3$ alkyl group, a $C_1$-$C_{10}$ alkoxy group, or a halogen atom; and p is an integer between 3 and 8, and a monomer represented by Formula 10 below:

$$RSiX_1X_2X_3 \qquad (10)$$

wherein R is a hydrogen atom, a $C_1$-$C_3$ alkyl group, a $C_3$-$C_{10}$ cycloalkyl group, or $C_6$-$C_{15}$ aryl group; and $X_1$, $X_2$ and $X_3$ are, independently, a $C_1$-$C_3$ alkyl group, a $C_1$-$C_{10}$alkoxy group or a halogen atom, using an acid catalyst and water in the presence of an organic solvent.

4. The composition according to claim 1, wherein the percentage content of the calixarene derivative in the composition is in the range of 0.1%-95% by weight, based on the sum of the amounts of the matrix precursor and calixarene derivative.

5. The composition according to claim 1, wherein the percentage content of the solvent in the composition is in the range of 20%-99.9% by weight.

6. The composition according to claim 1, wherein the solvent is selected from the group consisting of aromatic hydrocarbons, ketones, ethers, acetates, amides, γ-butyrolactones, alcohols, silicon solvents, and mixtures thereof.

7. The composition according to claim 5, wherein the solvent is selected from the group consisting of anisole, xylene, mesitylene, methyl isobutyl ketone, 1-methyl-2-pyrrolidinone, acetone, tetrahydrofuran, isopropyl ether, ethyl acetate, butyl acetate, propylene glycol monomethyl ether acetate, dimethylacetamide, dimethylformamide, γ-butyrolactone, isopropyl alcohol, butyl alcohol, octyl alcohol, silicon solvents, and mixtures thereof.

8. A method for forming a low dielectric constant film, comprising the steps of: coating the composition according to claim 1 on a semiconductor substrate by spin coating, dip coating, spray coating, flow coating, or screen printing; evaporating the solvent from the coated substrate; and heat-curing the coated substrate to 150-600° C. under an inert atmosphere or vacuum.

9. A nanoporous structure produced using the composition according to claim 1.

10. A method of making an article comprising incorporating the nanoporous structure according to claim 9 into said article.

11. The method according to claim 10, wherein said article is a heat resistant material.

12. The method according to claim 10, wherein said article is an electrical insulator.

13. The method according to claim 10, wherein said article is an absorbent.

14. The method according to claim 10, wherein said article is a catalyst support.

15. A heat resistant material comprising the nanoporous structure according to claim 9.

16. An electrical insulator comprising the nanoporous structure according to claim 9.

17. An adsorbent comprising the nanoporous structure according to claim 9.

18. A support for a catalyst comprising the nanoporous structure according to claim 9.

* * * * *